(12) United States Patent
Jeong

(10) Patent No.: US 7,448,396 B2
(45) Date of Patent: Nov. 11, 2008

(54) APPARATUS AND METHOD OF REMOVING PARTICLES

(75) Inventor: Chul Jeong, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 257 days.

(21) Appl. No.: 11/152,184

(22) Filed: Jun. 15, 2005

(65) Prior Publication Data

US 2005/0285104 A1    Dec. 29, 2005

(30) Foreign Application Priority Data

Jun. 28, 2004    (KR) ............... 10-2004-0049027

(51) Int. Cl.
    *B08B 6/00*    (2006.01)
(52) U.S. Cl. ............ 134/1.3; 216/30; 430/329; 430/3; 430/330; 427/64; 427/66; 427/67; 427/350

(58) Field of Classification Search ............. 216/30; 430/329; 134/1.3
    See application file for complete search history.

(56) References Cited

U.S. PATENT DOCUMENTS 4,631,250 A * 12/1986 Hayashi ............ 430/329
6,155,275 A * 12/2000 Shinbara ............ 134/61
2001/0000477 A1 * 4/2001 Harada ............ 427/534

* cited by examiner

*Primary Examiner*—Nadine Norton
*Assistant Examiner*—Maki Angadi
(74) *Attorney, Agent, or Firm*—McKenna Long & Aldridge LLP

(57) ABSTRACT

An impurities elimination apparatus including a base plate, a first nozzle for removing impurities on the base plate using air suction, a glass substrate disposed on the base plate, and a second nozzle for coating the glass substrate with an organic material.

3 Claims, 11 Drawing Sheets

APPARATUS AND METHOD OF REMOVING PARTICLES

This application claims the benefit of the Korean Patent Application No. P2004-049027 filed on Jun. 28, 2004, which is hereby incorporated by reference in its entirety.

BACKGROUND OF THE INVENTION

1. Field of the Invention

The present invention relates to a liquid crystal display device, and more particularly to an apparatus and a method of removing impurities from a liquid crystal display device.

2. Discussion of the Related Art

In today's information society, a display device is now even more important than ever as a visual information communication medium. A cathode ray tube or braun tube, which is typically as a visual information communication medium, has a problem in that its weight and size are too big. Various kinds of flat display devices have been developed that overcome the limits of the cathode ray tube. The types of flat display devices include a liquid crystal display LCD device, a field emission display FED, a plasma display panel PDP and an electroluminescence EL, and most of them are put to practical use and on the market.

The liquid crystal display device can satisfy the trend of today's electronic products being light, thin, and small. Further, mass productivity of liquid crystal display device has been improved such that they are rapidly be used as a substitute for the cathode ray tube in many application fields. The active matrix liquid crystal display device, which drives a matrix of liquid crystal cells that each use a thin film transistor (hereinafter, referred to as "TFT"), especially has an advantage in that its picture quality is excellent and its power consumption is low. Due to the recent advances in mass production technology, the active matrix liquid crystal display device is now being researched and developed to have a large-size and a high-resolution.

The liquid crystal display device, which displays a picture through such a liquid crystal display panel, controls the light transmissivity of liquid crystal by use of an electric field, thereby displaying a picture. For this, the liquid crystal display device includes a liquid crystal display panel where liquid crystal cells are arranged in a matrix, and a drive circuit to drive the liquid crystal display panel.

FIG. 1 is an expanded perspective view of a related art liquid crystal display panel. As shown in FIG. 1, the related art liquid crystal display panel 1 has a color filter array substrate 20 and a TFT array substrate 30 bonded together. A liquid crystal layer 10 is positioned between the color filter array substrate 20 and the TFT array substrate 30. The liquid crystal display panel 1 shown in FIG. 1 represents a part of the whole effective screen.

In the color array substrate 20, a color filter 24 and a common electrode 26 are formed on the rear surface of an upper glass substrate 22. A polarizer 28 is adhered onto the front surface of the upper glass substrate 22. The color filter 24 has red R, green G and blue B color filter layers arranged therein to transmit light of a specific wavelength range, thereby enabling a color display. A black matrix (not shown) is formed between the color filters 24 of adjacent colors. The black matrix is formed between the red R, green G and blue B color filters 24 to separate the red R, green G and blue B color filters 24 and to absorb the light, which is incident from the adjacent cells, thereby preventing the contrast from being deteriorated.

In the TFT array substrate 30, data lines 34 and gate lines 40 cross each other on the front surface of a lower glass substrate 32. A TFT 38 is formed adjacent to a crossing of the data lines 34 and the gate lines 40. A pixel electrode 36 is formed in a cell area defined between the data lines 34 and the gate lines 40 on the front surface of the lower glass substrate 32.

The TFT 38 includes a gate electrode connected to the gate line 40, a source electrode connected to the data line 34, and a drain electrode facing the source electrode with a channel therebetween. The TFT 38 is connected with the pixel electrode 36 through a contact hole that penetrates the drain electrode. The TFT 38 supplies a data signal from the data line 34 to the pixel electrode 36 in response to a gate signal from the gate line 40. More particularly, the TFT 38 switches a data transmission path between the data line 34 and the pixel electrode 36 in response to a scan signal from the gate line 40, thereby driving the pixel electrode 36. The polarizer 42 is adhered to the rear surface of the TFT array substrate 30.

The pixel electrode 36 is located in the cell area, which is defined between the data lines 34 and the gate lines 40, and is formed of a transparent conductive material having high light transmissivity. The pixel electrode 36 generates a potential difference with respect to the common electrode 26, which is formed at the upper glass substrate 22, as a result of the data signal supplied through the drain electrode. The liquid crystal layer 10 controls the transmissivity of the light, which is incident through the TFT array substrate 30, in response to the electric field applied across the liquid crystal layer 10. If the potential difference between the pixel electrode 36 and the glass substrate 22 is generated, the liquid crystal of the liquid crystal layer 10 that is located between the lower glass substrate 32 and the upper glass substrate 22 rotates by dielectric anisotropy. Accordingly, the light supplied from a light source through the pixel electrode 36 is transmitted to the upper glass substrate 22. The polarizers 28 and 42 adhered onto the color filter array substrate 20 and the TFT array substrate 30 will transmit the polarized light when the polarizing directions of the polarizers perpendicularly cross each other and the liquid crystal of the liquid crystal layer 10 is a 90° TN mode. An alignment film (not shown) is formed at the opposite surfaces the liquid crystal of the color filter array substrate 20 and the TFT array substrate 30.

In order to form an organic insulator and a pattern on the color filter array substrate 20 and the TFT array substrate 30, an organic material or a photo-resist is spread over the upper glass substrate 22 and a lower glass substrate 32 where electrode or line materials are formed. And then, a photo-resist pattern is formed by performing an exposure process in which ultraviolet light is selectively illuminated onto the photo-resist, which is composed of a mask substrate where an area formed of a transparent material and exposed forms an exposure area, and a shielding layer formed on the mask substrate to form a shielding area. Then, a development process is performed in which the exposed photo-resist is developed. Subsequently, the electrode and the line materials are patterned by an etching process using the photo-resist pattern as a mask, thereby forming a pattern. An organic insulating material used as the photo-resist pattern is coated on the glass substrates 22 and 32 by a spinless coating method.

The spinless coating method can achieve a uniform thin film characteristic, regardless of the size of the glass substrates 22 and 32, in comparison with a spin coating method in which a thin film is coated on the substrates 22 and 24 by the rotation of a shaft. When performing the spinless coating method, the glass substrate is placed on a stone surface plate of a coating device. When the coating is completed, the coated substrate is moved to a next process and a new substrate is placed on the stone surface plate. In the process of changing the substrates, impurities, such as an organic material stuck to the nozzle or the particles of the photo-resist, might drop onto the stone surface plate. However, when using the current process of spinless coating, the impurities remain on the stone surface plate. Thus, the stone surface plate is cleaned manually by a person.

FIG. 2 illustrates the effects on a photo-resist or an organic insulating material, when impurities remain on a stone surface plate 100 on which a glass substrate 110 is placed. If the impurities 130 remain on the stone plate 100 when the substrate 110 is placed on the stone surface plate 100, the photo-resist 120 coated on the substrate 22 may develop protrusions from impurities 130 kicked-up during placement of the glass substrate 110. Accordingly, as shown in the cross-sectional diagram of FIG. 2, if the impurities remain on the glass substrate 110, as can be seen from the plan view of FIG. 2, there occurs a phenomenon in that the photo-resist 120 film has a black stain on the right side and a white stain on the left side with the impurities 130 at their center. In this way, impurities remaining on the stone surface plate of the coating device in the related art causes the film thickness of the photo-resist 120 not to be uniform and the stain to be generated in the coated photo-resist 12, thereby decreasing the productivity of the liquid crystal display device and deteriorating the display quality. On the other hand, even though the impurities remaining on the stone surface plate can be removed manually, i.e., by the hand of an operator, it takes a lot of time to perform such a manual operation, thus productivity is reduced.

SUMMARY OF THE INVENTION

Accordingly, the present invention is directed to an apparatus and a method for removing impurities that substantially obviate one or more of the problems due to limitations and disadvantages of the related art.

An object of the present invention is to provide an apparatus and a method for automatically removing impurities which might be generated in an organic material coating process of a fabricating process of a liquid crystal display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an impurities elimination apparatus includes a base plate, a first nozzle for removing impurities on the base plate using air suction, a glass substrate disposed on the base plate, and a second nozzle for coating the glass substrate with an organic material.

In another aspect, an impurities elimination apparatus includes a base plate, a first nozzle for removing impurities by air suction, a glass substrate disposed on the base plate, a second nozzle for dispensing photo-resist, a gantry on which the first and second nozzles are mounted, an air suction driver for providing air suction for the gantry, and a photo-resist supplier for supplying the photo-resist to the gantry.

In another aspect, a method of eliminating impurities includes the steps of initializing a first nozzle and a second nozzle at a coating stand-by location, loading a glass substrate on a base plate, coating the glass substrate with an organic material through the second nozzle, removing the glass substrate that is coated with the organic material, and removing impurities on the base plate by air suction through the first nozzle.

In another aspect, an impurities elimination apparatus includes a base plate, a first nozzle for removing impurities on the base plate using air suction, a second nozzle for dispensing organic material and a gantry on which the first and second nozzles are mounted, the gantry is movable between opposite ends of the base plate.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 3 to 7.

Figure 1:
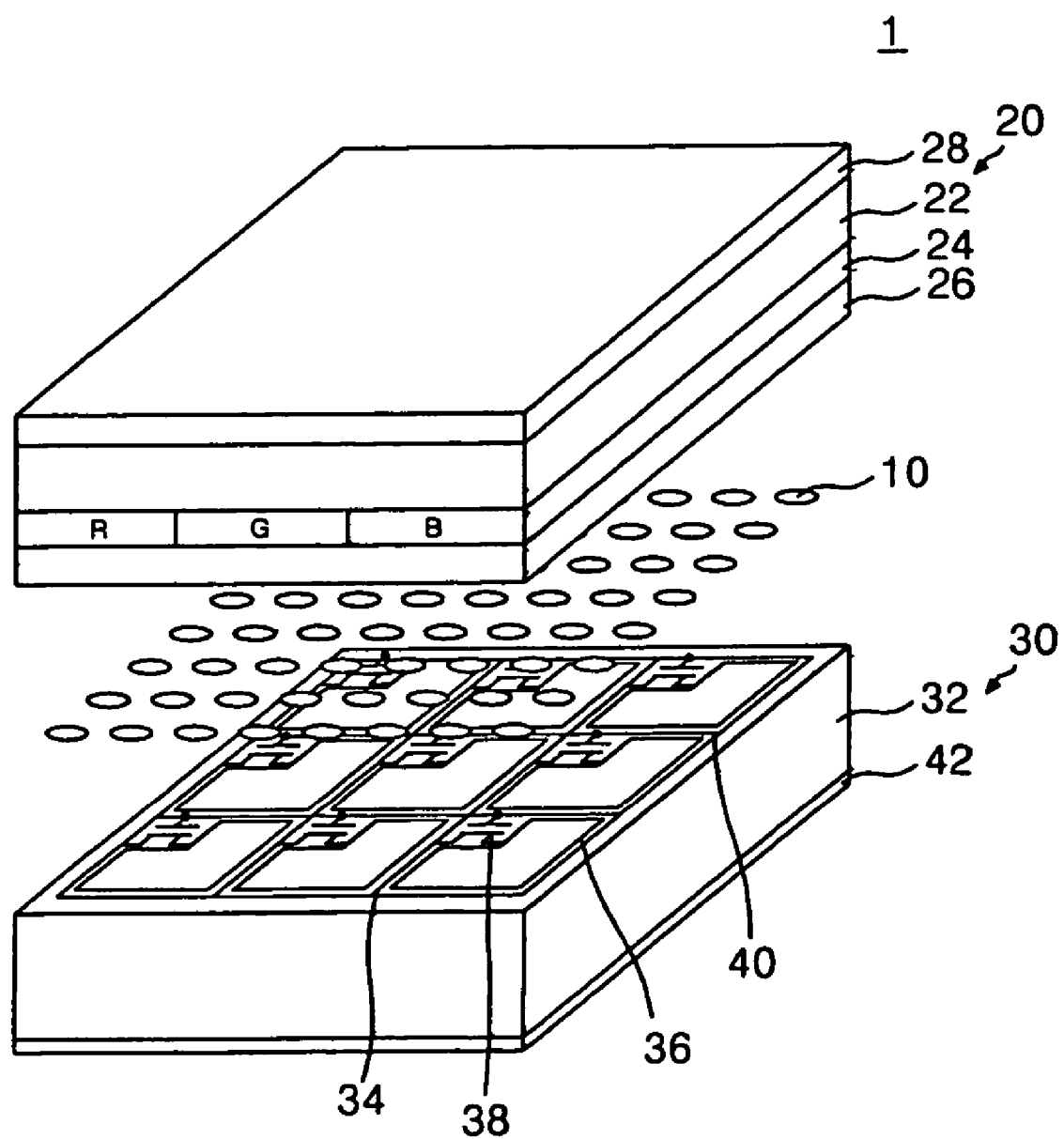
FIG. 1 an expanded perspective view of a related art liquid crystal display panel.
Figure 2:
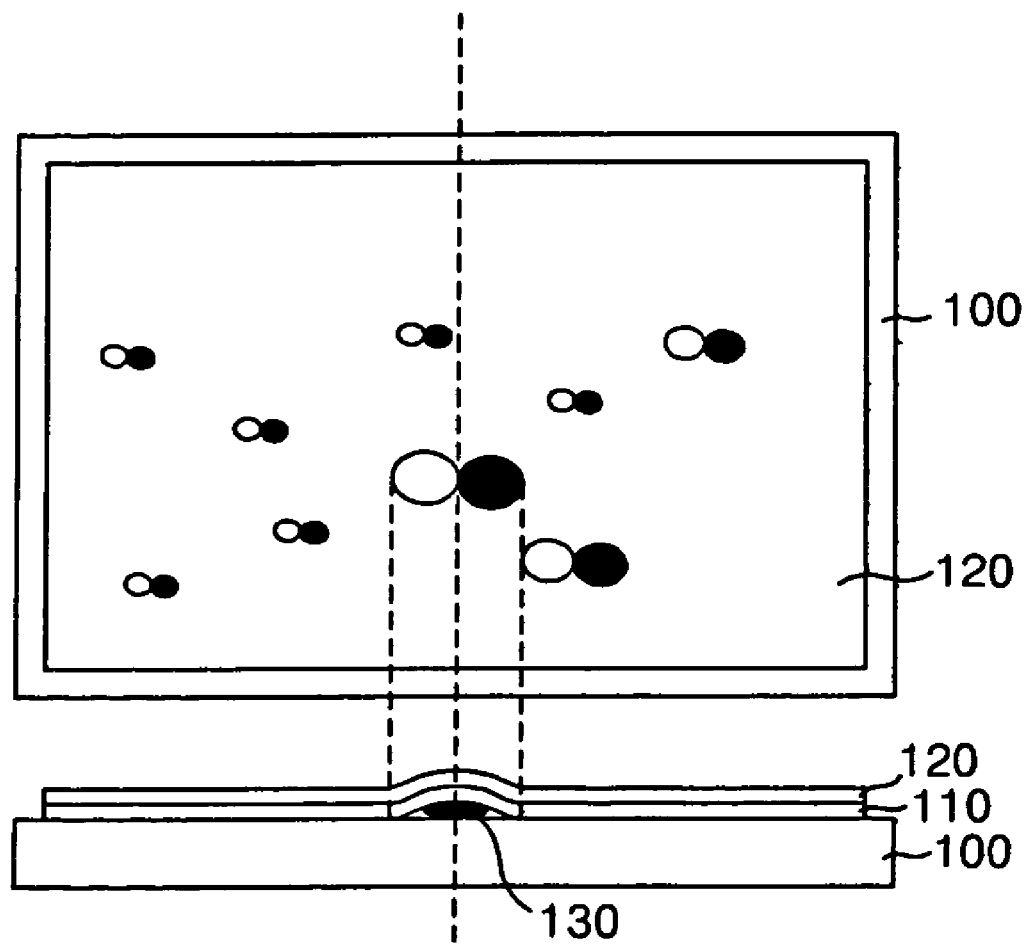
FIG. 2 is a schematic view illustrating effects on a glass substrate by impurities in the related art.
Figure 3:
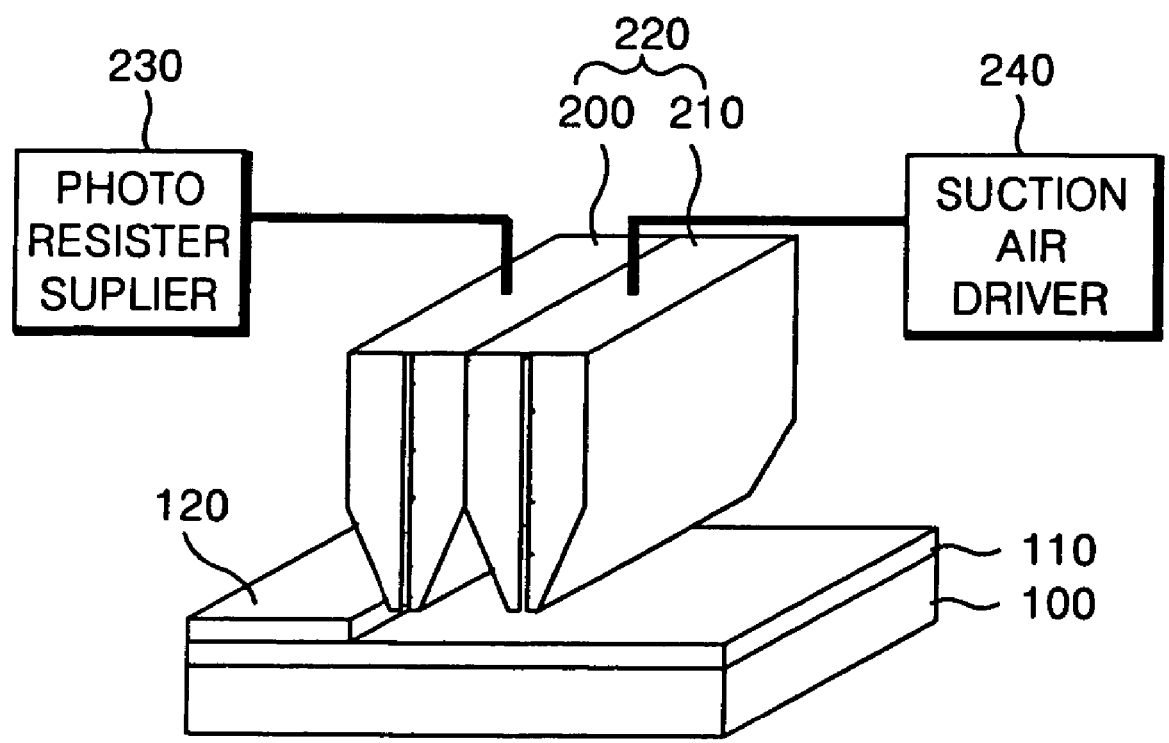
FIG. 3 illustrates a configuration of an impurities elimination apparatus according to an embodiment of the present invention.

FIG. 3 illustrates a configuration of an impurities elimination apparatus according to an embodiment of the present invention. Referring to FIG. 3, the impurities elimination apparatus includes a base plate 100, wherein the base plate 100 can be manufactured as a stone surface base plate or other materials, a glass substrate 110 positioned on the base plate 100, a gantry 220 which removes impurities remaining on the base plate 110 and which coats the glass substrate 110, which is put on the base plate 100 from where the impurities are removed, with a photo-resist or an organic material, such as polyimide, by a spinless coating method, a photo-resist supplier 230 to supply the photo-resist to the gantry 220, and an air suction driver 240 to provide air suction for the gantry 220.

The gantry 220 includes a coating nozzle to dispense photo-resist on the glass substrate 110, and a suction nozzle 210 to suck impurities 130 from the surface of the base plate 100. The coating nozzle 200 and the suction nozzle 210 are formed to be on the same gantry 220. The gantry 220 moves across the glass substrate 110 in a first direction and dispense photo-resist onto the glass substrate 110 as well as move in a second direction opposite to the first direction to remove impurities 130 from the surface of the base plate.

After the glass substrate 110 is coated, it is moved from the base plate 100 to another station for the next process. At this moment, impurities 130, e.g., particles, such as remainders of the photo-resist, might remain on the surface of the base plate 100. Impurities remaining on the base plate 100 are removed by air suction of the suction nozzle 210 of the gantry 220 as the gantry is moved back across the base plate 100 to its starting position.

Figure 4:
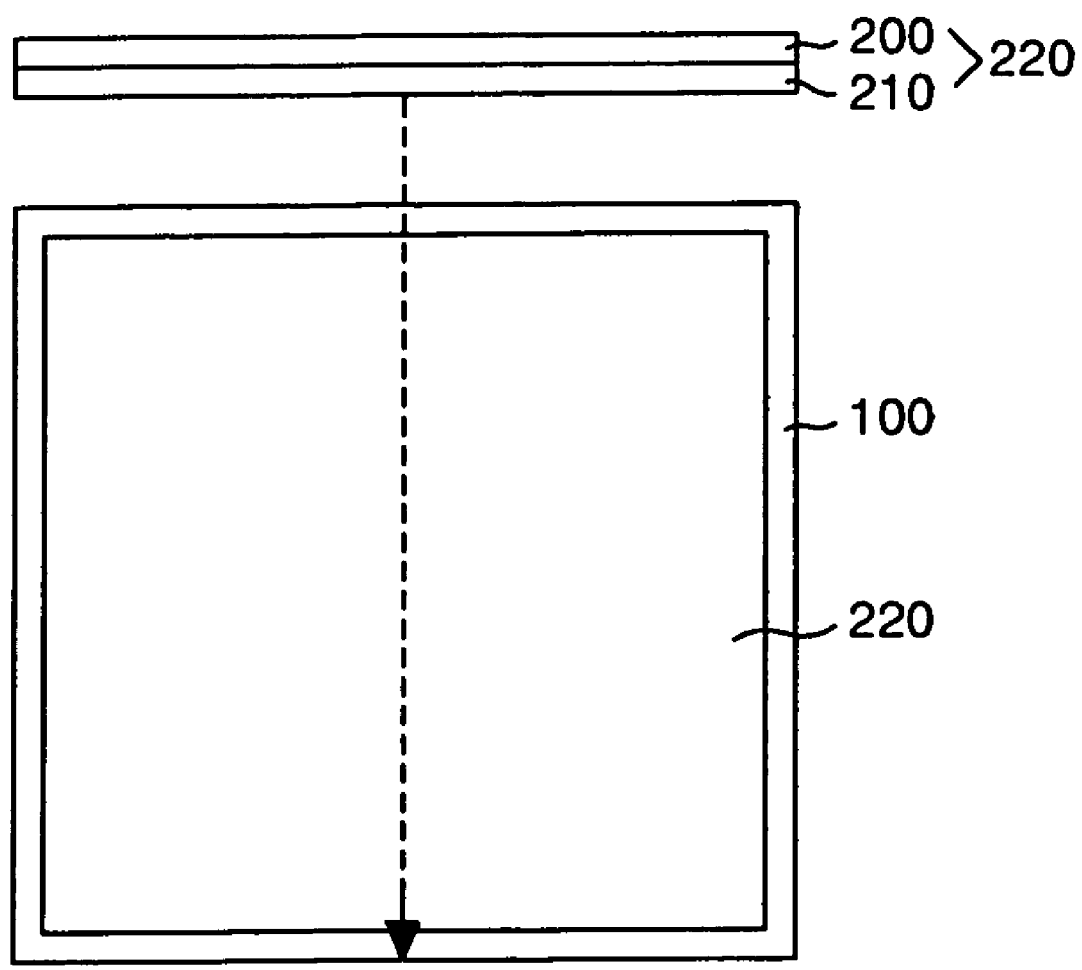
FIG. 4 illustrates a coating stand-by state and a movement of a gantry for coating a glass substrate according to an embodiment of the present invention.
Figure 5:
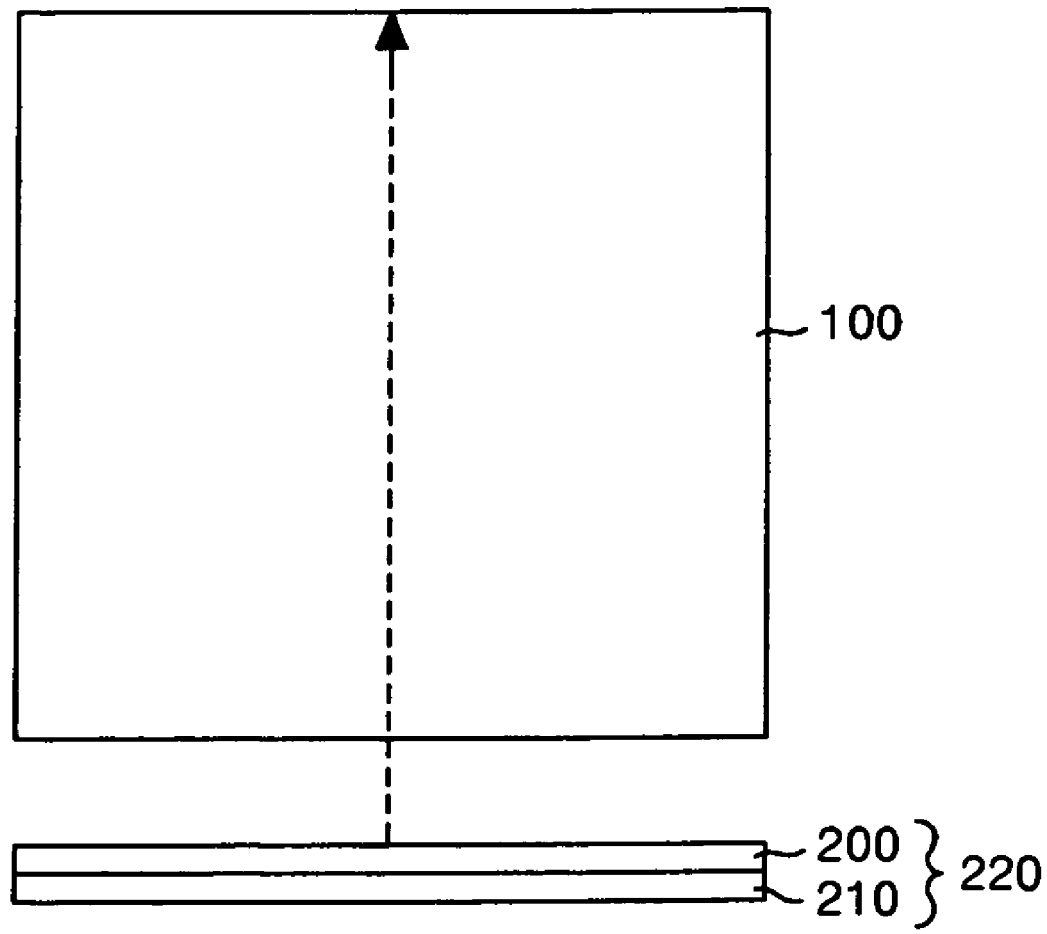
FIG. 5 illustrates a suction stand-by state and a movement of a gantry for removing impurities according to an embodiment of the present invention.

FIG. 4 illustrates a coating stand-by state and a movement of a gantry for coating a glass substrate according to an embodiment of the present invention. As the gentry 220 is moved to a location of a coating stand-by state, shown in FIG. 4, to a location of a suction stand-by state by a gentry transportation means (not shown), the glass substrate 210 is coated with photo-resist. FIG. 5 illustrates a suction stand-by state and a movement of a gantry for removing impurities according to an embodiment of the present invention. As the gantry 220 is moved to a location of a coating stand-by state, shown in FIG. 4, from a location of a suction stand-by state, shown in FIG. 5, by a gentry transportation means (not shown), impurities are removed from the base plate 100. Thus, the coating stand-by location is on one end of the base plate and a suction stand-by location is at another end of the base plate.

FIG. 4 also illustrates the coating stand-by state of the glass substrate 110 on the base plate 100. A coating nozzle and a vacuum nozzle are arranged to be separated from the base plate 100 by a fixed distance, and the glass substrate 110 in a coating stand-by state is positioned on the upper surface of the base plate 100. The gantry 220 is driven so that the gantry 220 moves across the glass substrate 110 to perform a photo-resist coating of the glass substrate 110.

FIG. 5 illustrates that the gantry 220 is in a suction stand-by state before a bare glass substrate 110 is disposed on the base plate 100 and after the coated glass substrate 110 is moved to a next processing station. Referring to FIG. 5, as the gantry 220 moves from a suction stand-by location to an original location, i.e., a coating stand-by location (refer to FIG. 4), the gentry 220 sucks in and removes the impurities on the surface of the base plate 100.

FIGS. 6A to 6E are schematic views explaining the operation of an impurities elimination apparatus according to an embodiment of the present invention.

Figure 6A:
FIGS. 6A to 6E are schematic views exemplifying an operation of an impurities elimination device according to an embodiment of the present invention.

Referring to FIG. 6A, the gantry 220 is located at a first location of the base plate 100, i.e., a coating stand-by location.

Figure 6B:

And then, as shown in FIG. 6B, the glass substrate 110 is put on the upper surface of the base plate 100 to coat the glass substrate 110 with photo-resist.

Figure 6C:
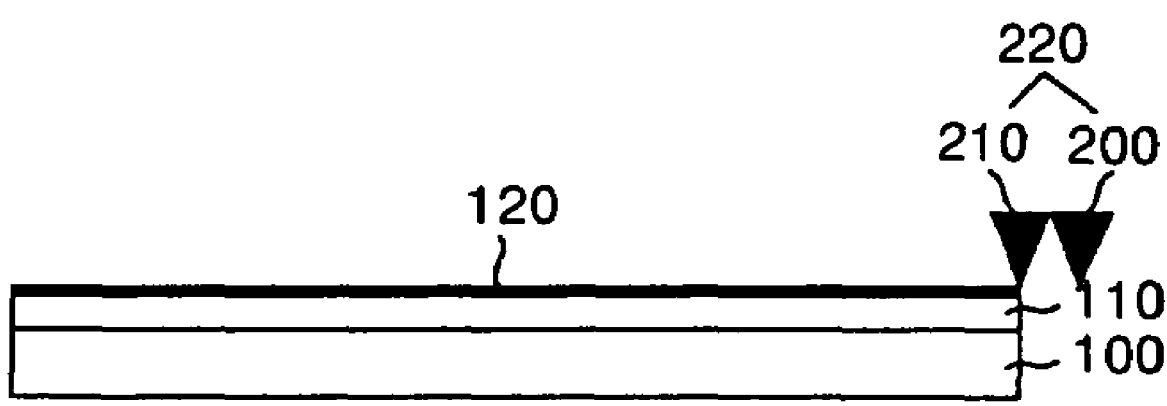

Referring to FIG. 6C, as the gantry 220 moves across the glass substrate 110, photo-resist 120 is dispensed from a coating nozzle 200, which is mounted on the gantry 220. Thus, the photo-resist 120 is coated onto the glass substrate 110. When the coating is completed, the gantry 220 reaches a second location, i.e., a location for sucking in the impurities. In other words, a suction stand-by location opposite to the coating stand-by location, and the glass substrate 110 is moved to a next processing station.

Figure 6D:
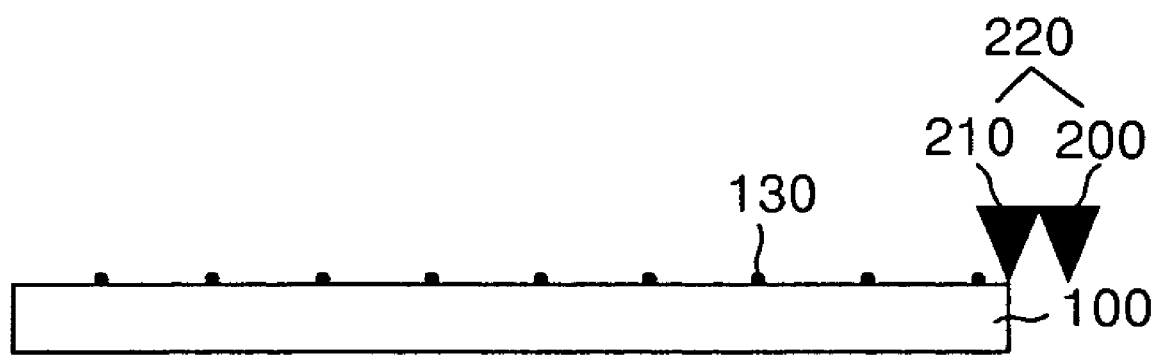

A shown in FIG. 6D, impurities 130 from the photo-resist coating process might remain on the base plate 100. The impurities 130 generate a critical problem in that they can cause a stain on the next glass substrate 110, which is to be coated with the photo-resist.

Figure 6E:

Accordingly, as shown in FIG. 6E, the impurities 130 on the base plate 100 are removed as the gantry 220 moves from the suction stand-by location moves to the left such that the impurities 130 remaining on the surface of the base plate 100 are sucked in and removed by use of the suction nozzle 210, which is mounted on the gantry 220.

Figure 7:
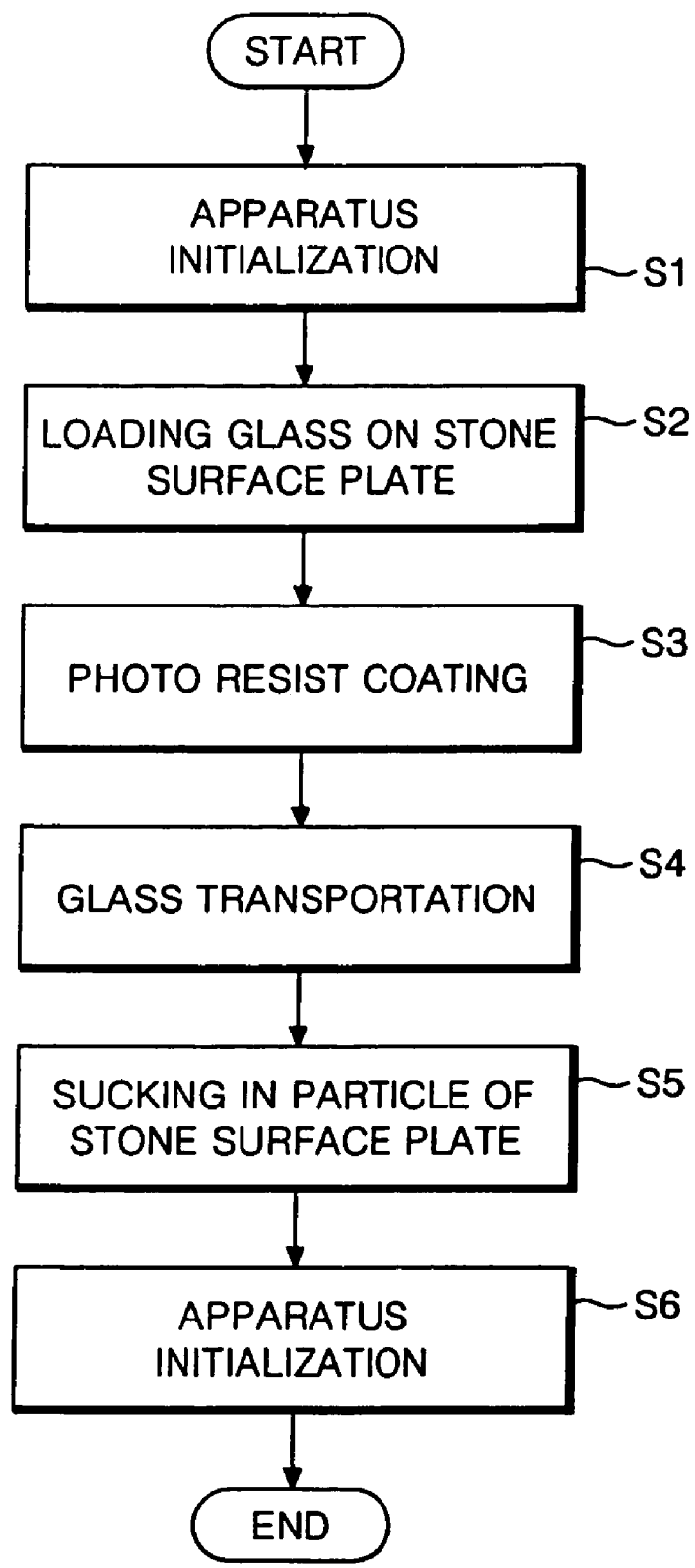
FIG. 7 is a flow chart explaining the operation of the impurities elimination device according to the embodiment of the present invention.

FIG. 7 is a flow chart explaining the operation of the impurities eliminating apparatus according to an embodiment of the present invention.

First, the impurities elimination apparatus is initialized, and the gantry 220 is disposed at the coating stand-by location (Step S1).

And then, the glass substrate 110 is put on the base plate 100, such as a stone surface base plate. (Step S2).

Subsequently, the gantry 220 is driven to perform the photo-resist coating by use of the coating nozzle 200 mounted on the gantry 220 (Step S3).

And then, the glass substrate 110 having a photo-resist coating thereon is moved to the next processing station (Step S4). At this moment, a lot of impurities remain on the surface of the base plate 100 after the glass substrate 100 is moved.

Accordingly, as the gantry 220 is moved to its original location, i.e., the location for beginning the photo-resist coating, the impurities 130 on the base plate 100 are sucked in and removed (Step S5). After the impurity removal process is completed in this way, the impurities elimination apparatus is ready for coating the next glass substrate 110 (Step S6).

As described above, the impurities elimination apparatus and method according to the present invention automatically vacuum-cleans the impurities off the stone plate, which is used in the spinless coating process of the liquid crystal display device, thus it increases the productivity of the liquid crystal display device, increases the uniformity of the film thickness of the photo-resist and prevents the contamination of the photo-resist, thereby enabling to improve the display quality of the liquid crystal display device.

It will be apparent to those skilled in the art that various modifications and variations can be made in the apparatus and a method of removing impurities of the present invention without departing from the spirit or scope of the invention. Thus, it is intended that the present invention cover the modifications and variations of this invention provided they come within the scope of the appended claims and their equivalents.

What is claimed is:

1. A method of eliminating impurities, comprising the steps of:
    initializing a first movable nozzle and a second movable nozzle at a coating stand-by location;
    loading a glass substrate on a base plate;
    coating the glass substrate with an organic material through the second nozzle while the first and second nozzles are moved along a linear transportation path from the coating stand-by location to a suction stand-by location;
    removing the glass substrate coated with the organic material at the suction stand-by location; and
    removing impurities on the base plate by air suction through the first nozzle while the first and second nozzles are moved along a linear transportation path from the suction stand-by location to a coating stand-by location, wherein the coating stand-by location and the suction stand-by location are at opposite ends of the base plate.

2. The method according to claim 1, wherein the organic material includes a photo-resist.

3. The method according to claim 1, wherein the base plate includes a stone surface plate.

* * * * *